United States Patent [19]
Bradbury et al.

[11] Patent Number: 5,200,360
[45] Date of Patent: Apr. 6, 1993

[54] METHOD FOR REDUCING SELECTIVITY LOSS IN SELECTIVE TUNGSTEN DEPOSITION

[75] Inventors: Donald R. Bradbury, Palo Alto; Gary W. Ray, Mountain View, both of Calif.

[73] Assignee: Hewlett-Packard Company, Palo Alto, Calif.

[21] Appl. No.: 792,520

[22] Filed: Nov. 12, 1991

[51] Int. Cl.$^5$ .......................................... H01L 21/44
[52] U.S. Cl. ................................. 437/192; 437/190; 437/228
[58] Field of Search ...................... 437/190, 192, 228

[56] References Cited

U.S. PATENT DOCUMENTS

| | | | |
|---|---|---|---|
| 4,804,560 | 2/1989 | Shioya et al. | 427/125 |
| 4,902,533 | 2/1990 | White et al. | 437/228 |
| 4,948,755 | 8/1990 | Mo | 437/195 |
| 4,981,550 | 1/1991 | Huttemann et al. | 156/643 |
| 4,990,467 | 2/1991 | Lee et al. | 437/192 |
| 5,066,612 | 11/1991 | Ohba et al. | 437/192 |
| 5,084,414 | 1/1992 | Manley et al. | 437/192 |

FOREIGN PATENT DOCUMENTS 63-44730  2/1988  Japan .

OTHER PUBLICATIONS

S. Wolf et al., *Silicon Processing for the VLSI Era*, vol. 1, Lattice Press, Sunset Beach, Calif., 1986, pp. 429, 452–453.
S. Wolf, *Silicon Processing for the VLSI Era*, vol. 2, Lattice Press, Sunset Beach, Calif., 1990.

Primary Examiner—Brian E. Hearn
Assistant Examiner—Laura M. Holtzman

[57] ABSTRACT

A method of forming a plug for electrical connection between two metallic layers on an integrated circuit substrate includes retaining an antinucleation resist layer atop an insulator layer through which the plug is to be formed. After a contact hole is etched through the insulator layer, the antinucleation resist layer is baked. Cleaning of an area exposed by said contact hole in order to minimize contact resistance occurs during a two step process of argon sputter etching and oxygen plasma descumming the exposed area. Because the argon sputter etch and the oxygen plasma descum uncover an annular region about the contact hole, a concentration of phosphorous within the insulator layer and a low temperature selective deposition are used to reduce the occurrence of unwanted nucleation. After selective deposition, the antinucleation resist layer is stripped and an upper metallic layer is formed.

4 Claims, 3 Drawing Sheets

METHOD FOR REDUCING SELECTIVITY LOSS IN SELECTIVE TUNGSTEN DEPOSITION

DESCRIPTION

1. Technical Field

The present invention relates generally to the fabrication of an integrated circuit and more particularly to the formation of a plug for providing electrical connection to a metallic layer of the integrated circuit.

2. Background Art

An ever-present goal in the fabrication of integrated circuits is miniaturization of a resulting structure. A concern that must receive increasing attention as circuit density increases is the need to achieve low resistance connections between two conductive layers that are separated by an insulator layer. Contacts, or "plugs", having a diameter of less than one micron have been employed for electrically interconnecting two conductive layers.

FIGS. 1A-1D illustrate one method of forming a plug to electrically connect an upper conductive layer to a lower conductive layer. The lower conductive layer 10 is deposited on a first insulator layer 12. A second insulator layer 14 atop the conductive layer 10 is patterned to form a contact hole 16 by use of a photoresist 18 and well-known photolithographic techniques. As shown in FIG. 1C, the photoresist is then removed. A plug 20 is formed within the contact hole, whereafter an upper conductive layer 22 is deposited. The plug is an electrically conductive material that permits electrical communication between the two conductive layers 10 and 22, as shown in FIG. 1D.

One material commonly used in forming the plug 20 is polysilicon having a high concentration of dopant, such as phosphorous. However, as the size of plugs becomes smaller, the need for a plug material having a lower resistance increases. The resistance of connections affects the speed of a circuit.

Aluminum is a low resistance alternative to the polysilicon. However, as pointed out in U.S. Pat. No. 4,948,755 to Mo the step coverage of aluminum may not be sufficient for submicron plugs. That is, the high aspect ratio of the thickness of the second insulator layer 14 to the diameter of the contact hole 16 may prevent the aluminum from stepping down into the contact hole to form the solid plug. Mo teaches that another drawback associated with the use of aluminum is the occurrence of electromigration.

Tungsten is a third alternative. Either a blanket deposition or a selective deposition of tungsten reliably fills the entire contact hole 16. The step coverage of tungsten is superior to aluminum, so that a blanket deposition onto the surface of the second insulator layer 14 forms the plug, whereafter the tungsten on the surface of the second insulator layer is etched to leave a plug surface that is coplanar with the surface of the second insulator layer. U.S. Pat. No. 4,981,550 to Huttemann et al. teaches that a problem in blanket depositing tungsten arises from the difficulty of achieving a uniform thickness of the deposited tungsten blanket. If the etching step is continued sufficiently long to clear the tungsten from the insulator layer at the thickest point of the blanket, the tungsten in the contact holes may be severely etched at thinner areas of the blanket. Moreover, blanket depositing tungsten is significantly more expensive than selectively depositing tungsten.

While there are benefits to using selective tungsten to provide submicron contacts, this technique has not been widely accepted because of loss of selectivity on the insulator layer 14. The surface of the lower conductive layer 10 exposed by the contact hole 16 provides a nucleation site for the tungsten. For various reasons, nucleation sites also exist on the surface of the insulator layer 14. The nucleation sites on the insulator layer 14 may result in electrical shorting between devices on the integrated circuit to be fabricated. Thus, selectivity loss leads to a reduced yield.

There have been a great number of experiments to determine the cause of nucleation on the surface of the insulator layer 14. Moreover, there are multiple-step techniques which attempt to clean the insulator layer 14 to prevent unwanted nucleation. Multiple-step techniques decrease fabrication throughput, particularly when the extra steps must be formed in situ in the selective tungsten deposition equipment, thereby limiting the number of batches that can be inserted into the equipment within a given period of time. For example, U.S. Pat. No. 4,804,560 to Shioya et al. teaches that the selective deposition process should be periodically discontinued to remove tungsten nuclei that form a film on the insulator layer. The periodic etching of the spurious tungsten nuclei from the insulator layer is performed within a chemical vapor deposition (CVD) apparatus. Thus, the time required for achieving a desired plug within the CVD apparatus is significantly increased.

In comparison to the metal-to-metal plug 20 of FIG. 1D, U.S. Pat. No. 4,990,467 to Lee et al. teaches formation of a plug from a semiconductor material to an interconnect layer. Lee et al. teach a reversal of two steps described with reference to FIGS. 1A-1D. Rather than etching the photoresist material 18 prior to formation of the plug 20, the plug of Lee et al. is formed and then the photoresist is removed. Unwanted nuclei are removed simultaneously with the stripping of the photoresist material. While the patent teaches an improvement in reducing selectivity loss on the insulator layer, one concern is that the selectivity loss onto the photoresist layer may be to a degree at which a tungsten film, as described in Shioya et al., will cover an area of the photoresist material and will act as a mask during the subsequent stripping of the photoresist material. By acting as a mask, the unwanted tungsten film will prevent removal of the photoresist material and will lower the fabrication yield.

It is an object of the present invention to provide a method for forming low resistance metal-to-metal plugs by selective tungsten deposition techniques without selectivity loss and with a high fabrication yield.

SUMMARY OF THE INVENTION

The above object has been met by a method which utilizes a single layer first as a masking layer for forming contact holes and secondly as a processed antinucleation layer during formation of plugs. Using standard photoresist material, the contact holes are etched into an insulator layer to a metallic layer, whereafter processing preferably includes baking the photoresist to optimize polymer cross linkage, argon sputter etching to clean contacts, and oxygen plasma descumming to eliminate any polymer from the contacts for the subsequent selective tungsten deposition. The oxygen plasma is applied for only a short time, etching only an upper portion of the photoresist, so that the resist can function as the antinucleation layer. Unwanted nucleation on any surface area of the insulator layer that may be exposed during the sputter etching and oxygen plasma descum steps is minimized by use of a phosphorous addition to the insulator layer.

The insulator layer is deposited upon the metallic layer on a semiconductor substrate. An antinucleation resist layer is then formed on the insulator layer and is used to photolithographically etch a contact hole through the insulator layer to the metallic layer. It has been discovered that the reactive ion etching to create the contact hole displaces material from the metallic layer onto the upper surface of the antinucleation resist layer. The present invention maintains the antinucleation resist layer atop the insulator layer during selective tungsten deposition and the metallic contaminants are rendered ineffective for purposes of nucleation by processing the antinucleation resist layer.

It is believed that baking the antinucleation resist layer causes the metallic contaminants to be absorbed into the resist layer. There is a flow that occurs during cross linking and this flow absorbs the contaminants. After completion of the bake, the layer is thermoset. The bake of the resist should reach a temperature at least as great as the temperature of the subsequent selective tungsten deposition process, thereby ensuring that the resist material has released any gasses that might otherwise be released during the selective deposition.

As noted above, the prior art method includes stripping the resist layer in a step preceding selective tungsten deposition. The organic resist layer is stripped in an oxygen plasma etch, but the metallic contaminants do not burn off in the oxygen plasma since the contaminants are inorganic. Thus, during the sequence of steps of the prior art method, the metallic contaminants are oxidized slightly and are allowed to settle onto the insulator layer as nucleation sites. An advantage of the present invention is that maintaining the resist layer during the selective tungsten deposition prevents nucleation on the surface of the insulator layer. Moreover, baking the resist layer prior to the selective tungsten deposition reduces the likelihood of nucleation on the resist layer.

The steps of argon sputter etching and the oxygen plasma descumming clean the surface area of the metallic layer that is exposed by the contact hole, clear polymer from the exposed surface area, and condition the exposed surface area for the selective tungsten deposition. Thus, contact resistances of less than 1 ohm/plug have been achieved even at submicron levels.

Conditioning the exposed surface area of the metallic layer by the steps of sputter etching and oxygen plasma descumming removes an upper portion of the antinucleation resist layer and also exposes the upper surface of the antinucleation resist layer at a limited area surrounding the contact hole. It has been discovered that the amount of unwanted nucleation on the surface of an exposed insulator layer depends upon the number of dangling oxide bonds at the exposed surface. Consequently, the type of material used in forming the insulator layer plays a role in the number of nucleation sites, as does the temperature of the insulator layer during the selective tungsten deposition process. The present invention utilizes tetraethylorthosilicate (TEOS) having a phosphorous addition that ties up the dangling bonds. Moreover, the temperature during selective tungsten deposition is preferably kept below 300° C.

Silane ($SiH_4$) reduction of tungsten hexafluoride ($WF_6$) is utilized since it has a higher negative free energy for the reaction than does hydrogen ($H_2$) reduction. This increases the choices of materials that can be used for the metallic layer without a detrimental interface reaction at the junction of the tungsten plug and the metallic layer. In a preferred embodiment, the metallic layer is a titanium-tungsten capping layer for an aluminum-copper interconnect layer.

BEST MODE FOR CARRYING OUT THE INVENTION

Figure 1A:
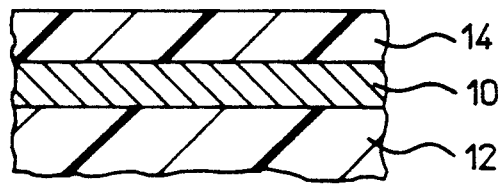
FIGS. 1A-1D are side sectional views of a prior art method of forming a plug for electrical communication between two metallic layers of an integrated circuit chip.
Figure 1B:
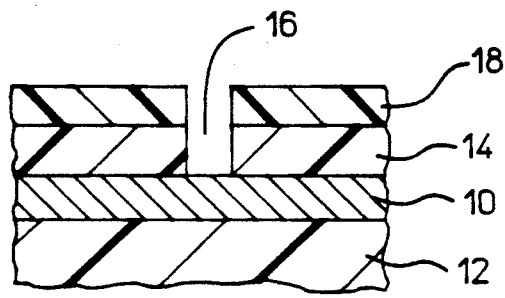
Figure 1C:
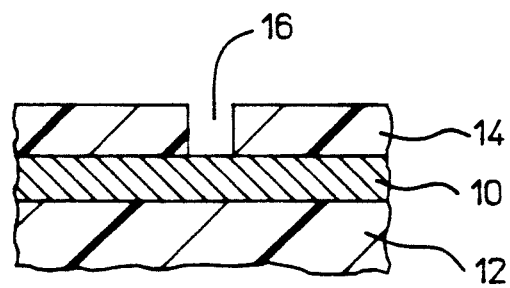
Figure 1D:
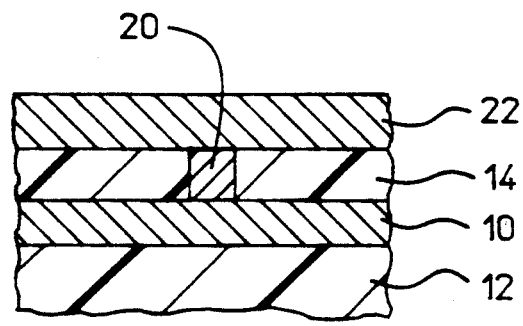
Figure 2:
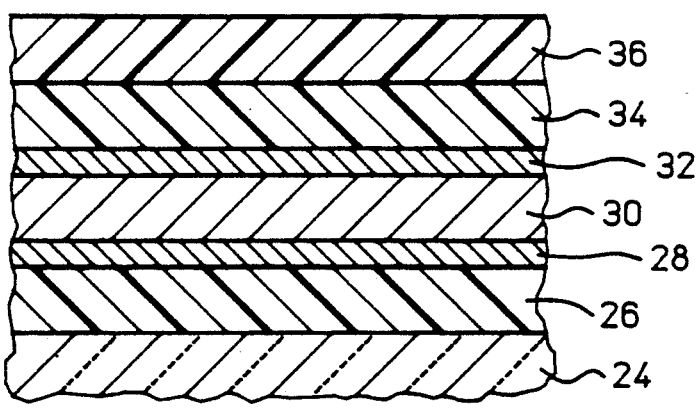
FIGS. 2-7 are side sectional views of steps in forming a plug to an insulator layer to provide electrical communication between two metallic layers in accord with the present invention.

With reference to FIG. 2, a number of layers are shown on a semiconductor wafer 24. The wafer may be made of silicon, but this is not critical. Deposited on the semiconductor wafer is a first insulator layer 26. The first insulator layer may comprise any typical and well-known dielectric material used in wafer fabrication, but preferably is TEOS.

Deposited onto the first insulator layer 26 is a metallic structure that includes an adhesion layer 28, a conducting layer 30 and a capping layer 32. The adhesion layer and the capping layer are titanium-tungsten (20% Ti by weight) barriers that are known in the art. The conducting layer 30 is an aluminum-copper layer. However, none of these materials is critical to the present invention. The adhesion layer 28 forms an adherent contact for the conducting layer 30 to the first insulator layer 26. The capping layer 32 serves a number of functions, including prevention of extrusion of the conducting layer during wafer fabrication and acting as an antireflection coating during photolithographic steps.

Typically, there are electrical connections between the semiconductor wafer 24 and the conducting structure provided by the three metallic layers 28, 30 and 32. In such case, a plug, not shown, is formed through the first insulator layer 26 prior to deposit of the adhesion layer 28. The plug through the first insulator layer 26 is preferably formed in a manner to be described below with reference to fabricating a plug through a second insulator layer 34. However, because the lower contact region is a semiconductor material, a process of selectively depositing tungsten within a contact hole through the first insulator layer 26 is less susceptible to unwanted nucleation atop the first insulator layer. Therefore, while preferably the plugs through all of the insulator layers are formed in a manner to be described below, plugs through the first insulator layer 26 may be formed using the method illustrated in FIGS. 1A-1D or by the method described in U.S. Pat. No. 4,990,467 to Lee et al.

Figure 3:
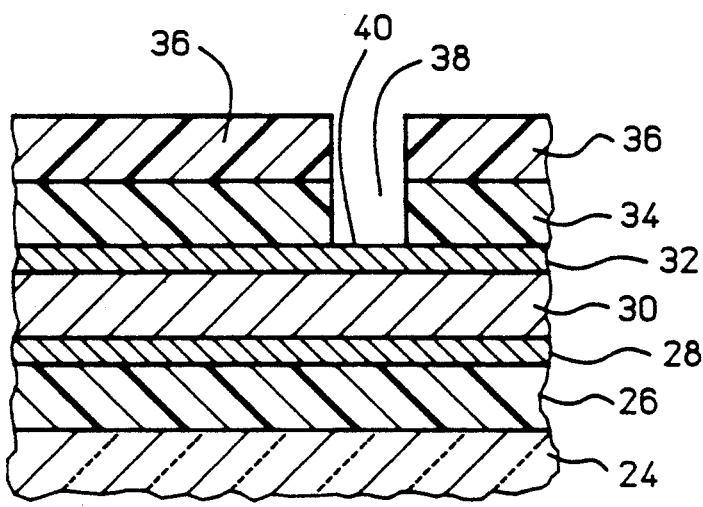

A photoresist 36 is deposited on the second insulator layer 34 in a manner well known in the art. The type of photoresist material is not critical. Referring now to FIG. 3, photolithographic techniques are utilized to provide a contact hole 38 through the second insulator layer 34 and the photoresist 36. The contact hole exposes an area 40 of the capping layer 32. Selective tungsten deposition techniques can then be utilized to fill the contact hole 38, thereby forming a plug in electrical contact with the exposed area 40 of the capping layer. However, unwanted nucleation occurs outside of the contact hole. As noted above, using conventional methodology the photoresist 36 is removed prior to selective tungsten deposition. The unwanted nucleation then occurs on the upper surface of the second insulator layer 34. The tungsten nuclei is difficult to remove without adversely affecting the plug. Tungsten that is not removed from the surface of the second insulator layer 34 may cause shorting between devices and may cause bumps when a second metallic structure is deposited upon the insulator layer.

The present invention utilizes the photoresist 36 as an antinucleation layer. One source of nucleation sites outside of the contact hole 40 is material that is displaced onto the photoresist during formation of the contact hole 38. In stripping the photoresist 36 by oxygen plasma etching, the organic photoresist would be removed, but any metallic contaminants that originate from the exposed area 40 would then settle on the upper surface of the insulator layer 34. The contaminants act as nucleation sites. The present invention maintains the photoresist 36 in position, but the metallic contaminants are still present. A high degree of nucleation on the photoresist 36 may create an effective masking layer that would function to prevent subsequent stripping of areas of the photoresist.

Figure 4:
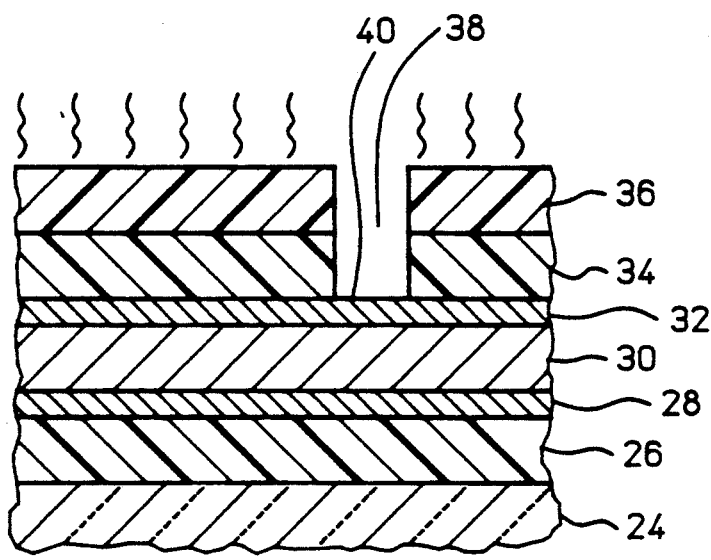

Referring now to FIG. 4, it has been discovered that baking the photoresist 36 significantly reduces the selectivity loss. The structure of FIG. 4 is baked at 250° C. for a period of one hour. It is believed that any metallic contaminants are absorbed into the photoresist during the step of baking the photoresist. A slight flow occurs prior to completion of polymer cross linkage. The metallic contaminants are absorbed during the flow, whereafter the photoresist is thermoset.

The temperature during the bake should reach the temperature of the subsequent selective tungsten deposition. This reduces the risk of the release of gasses that would adversely affect the selective deposition process. Instead, solvents and other sources of outgassing will be evaporated during the bake.

Figure 5:
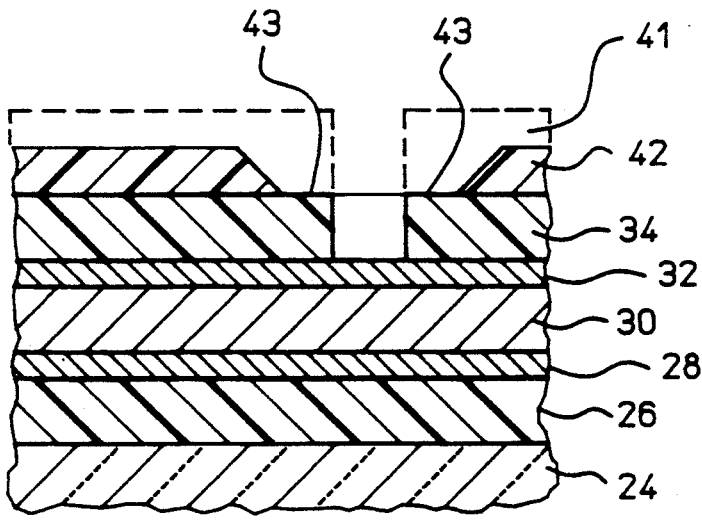

Referring now to FIG. 5, in order to provide a surface for low resistance connections, the structure is subjected to an argon sputter etch for one minute to clean the exposed area 40 of the capping layer 32, and then an oxygen plasma descum is provided for a period of fifteen seconds to clear any polymer from the exposed area 40 and to ready the exposed area for selective tungsten deposition. The argon sputter etch cleans the exposed area 40 of inorganic material, while the oxygen plasma descum removes any organic material from the exposed area. Combining these two steps prior to selective deposition provides contacts having a contact resistance of less than 1 ohm/plug, even at submicron levels.

In addition to removing any contamination from the exposed area 40 of the capping layer 32, the argon sputter etch and oxygen plasma descum remove an upper portion 41, shown in phantom, of the photoresist layer. A thinner photoresist layer 42 covers all of the second insulator layer 34 other than an annular region 43 surrounding the contact hole 38. The annular region is therefore exposed to sources of unwanted nucleation. It has been discovered that one such source of nucleation is the existence of dangling bonds of the insulator layer. Exposure of the TEOS insulator layer 34 to plasma causes a change in surface stoichiometry. This change increases the dangling bonds. Moisture has the potential of converting the dangling bonds of the exposed annular region 43 to OH bonds that act as nucleation sites during the selective tungsten deposition. However, the present invention includes the addition of 4% phosphorous to the TEOS second insulator layer. The concentration of phosphorous ties the dangling bonds to reduce nucleation counts to less than one nuclei/cm$^2$. The concentration should be in the range of 2% to 6%.

The next step is to selectively deposit tungsten. Selective tungsten deposition techniques are known in the art. The chosen technique will affect selectivity loss. Here, the selective tungsten is deposited at 250° C. for three minutes at 25 mTorr pressure. The low temperature deposition is less likely to assist in activating dangling bonds on the annular region 43 of the second insulator layer 34. Moreover, the 4% P addition to the TEOS insulator layer 34 has the tendency to tie up any dangling bonds that may exist.

Figure 6:
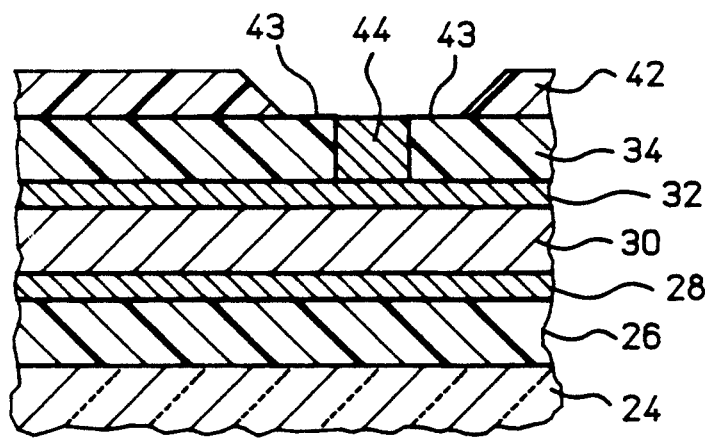

Silane (SiH$_4$) reduction of tungsten hexafluoride is preferred over hydrogen reduction during the selective tungsten deposition. Silane has a higher negative free energy for the reaction and therefore can be used with a greater number of capping layer 32 materials without detrimental interface reactions at the junction of the plug 44 of FIG. 6 and the capping layer 32.

Figure 7:
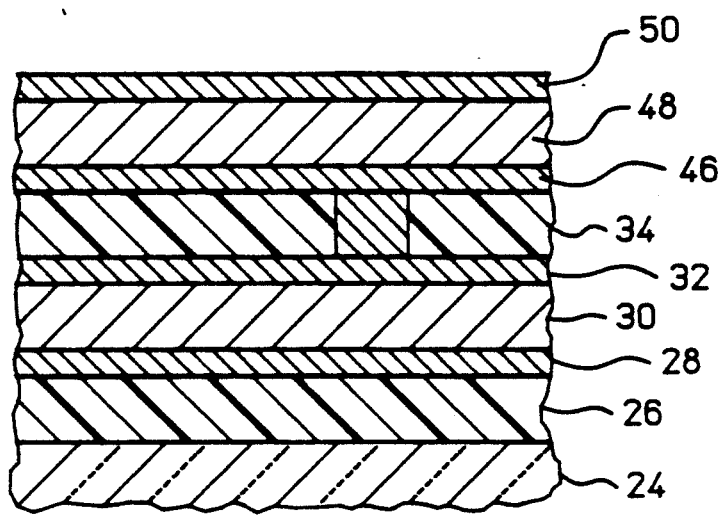

Referring now to FIG. 7, the photoresist is then stripped using standard oxygen plasma etching techniques. An aqueous solution is used to dissolve and remove any metallic contaminants that may reach the insulator layer at this point. A second conductive structure that includes an adhesion layer 46, a conducting layer 48 and a capping layer 50 is then deposited. The plug 44 allows electrical communication between the lower three metallic layers 30, 32 and 34 and the upper three metallic layers 46, 48 and 50. While the three-layered metallic structure 30-34 and 46-50 is preferred, a single conducting layer may be utilized without change to the method described above.

In operation, by reversing the conventional method of stripping the photoresist layer and then selectively depositing tungsten, the sacrificial photoresist layer 36 remains to prevent nucleation on the second insulator layer 34. A thermosetting bake causes any back sputtered metallic contaminants to be absorbed into the second insulator layer. The subsequent steps of argon sputter etching and oxygen plasma descumming are used to significantly increase the reliability and decrease the contact resistance of plug formation, but these steps expose an annular region 43 about each contact hole 38. However, the TEOS second insulator layer 34 has an addition of 4% phosphorus to tie up dangling bonds and to reduce the likelihood of unwanted nucleation on the exposed annular region. Selective tungsten deposition is at a low temperature that does not exceed the temperature of the bake, so that outgassing does not affect the deposition process.

We claim:

1. A method of providing a plug for electrical connection to a metallic layer on an integrated circuit substrate comprising:
    forming an insulator layer on a metallic layer;
    forming an antinucleation resist layer on said insulator layer;
    forming a contact hole through said antinucleation resist layer and said insulator layer;
    baking said antinucleation resist layer, effective for thermosetting said antinucleation resist layer;

removing an upper portion of said antinucleation resist layer, said removing including,
  exposing a region of said insulator layer about said contact hole,
  retaining a lower portion of said antinucleation resist layer to cover the remainder of said insulator layer, and
  argon sputter etching and oxygen plasma descumming said metallic layer to the extent exposed by said forming of said contact hole;
selectively depositing tungsten into said contact hole; and removing said antinucleation resist layer.

2. A method of providing a plug for electrical connection to a metallic layer on an integrated circuit substrate comprising:
  forming a metallic layer;
  forming a dielectric layer on said metallic layer;
  depositing a resist layer on said dielectric layer;
  etching contact holes in said dielectric layer using said resist layer;
  baking said resist layer;
  removing an upper portion of said resist layer, effective for leaving a lower portion of said resist layer covering said dielectric layer;
  selectively depositing tungsten in said contact holes;
  removing said lower portion of said resist layer; and
  said baking is conducted at a temperature at least as great as the temperature reached in said step of selectively depositing tungsten for at least one hour.

3. A method of providing an electrically conductive plug for electrical connection to a metallic layer on an integrated circuit substrate comprising:
  forming a metallic layer;
  forming a dielectric layer on said metallic layer;
  depositing a resist layer on said dielectric layer;
  etching contact holes in said dielectric layer using said resist layer;
  baking said resist layer;
  removing an upper portion of said resist layer, effective for leaving a lower portion of said resist layer covering said dielectric layer, wherein said step of removing includes argon sputter etching and oxygen plasma descumming said metallic layer to the extent exposed by said step of etching said contact holes;
  selectively depositing tungsten in said contact holes; and
  removing said lower portion of said resist layer.

4. A method of fabricating an integrated circuit comprising:
  forming a metallic layer;
  forming an insulator layer having a concentration of phosphorous on said metallic layer;
  forming a photoresist layer on said insulator layer;
  photolithographically etching a contact hole on said insulator layer using said photoresist layer, effective for exposing an area of said metallic layer;
  baking said photoresist layer;
  cleaning said exposed area of said metallic layer, said cleaning including,
    uncovering a region atop said insulator layer about said contact hole while leaving the remainder of said insulator layer covered by said photoresist layer, and
    sputter etching and oxygen plasma descumming said exposed area of said metallic layer;
  selectively depositing tungsten onto said exposed area of said metallic layer; and removing said photoresist layer.

* * * * *